United States Patent
Barr et al.

(10) Patent No.: US 9,206,520 B2
(45) Date of Patent: Dec. 8, 2015

(54) INHIBITING BACKGROUND PLATING

(75) Inventors: Robert K. Barr, Shrewsbury, MA (US);
Hua Dong, Shrewsbury, MA (US);
Thomas C. Sutter, Holden, MA (US)

(73) Assignee: Rohm and Haas Electronic Materials LLC

( * ) Notice: Subject to any disclaimer, the term of this patent is extended or adjusted under 35 U.S.C. 154(b) by 948 days.

(21) Appl. No.: 12/462,325

(22) Filed: Jul. 31, 2009

(65) Prior Publication Data

US 2010/0029077 A1  Feb. 4, 2010

Related U.S. Application Data (60) Provisional application No. 61/137,477, filed on Jul. 31, 2008.

(51) Int. Cl.
| | | |
|---|---|---|
| *H01L 21/44* | (2006.01) | |
| *C25D 5/02* | (2006.01) | |
| *C25D 5/34* | (2006.01) | |
| *H01L 31/0216* | (2014.01) | |
| *H01L 31/0224* | (2006.01) | |
| *C23C 28/00* | (2006.01) | |

(52) U.S. Cl.
CPC ............. *C25D 5/022* (2013.01); *C23C 28/322* (2013.01); *C23C 28/34* (2013.01); *C23C 28/345* (2013.01); *C25D 5/024* (2013.01); *C25D 5/028* (2013.01); *C25D 5/34* (2013.01); *H01L 31/02167* (2013.01); *H01L 31/02168* (2013.01); *H01L 31/022425* (2013.01); *Y02E 10/50* (2013.01)

(58) Field of Classification Search
USPC .................. 438/674, 675, 678, 686, 687; 257/E21.295, E21.023, E21.027, 257/E21.028
See application file for complete search history.

(56) References Cited

U.S. PATENT DOCUMENTS

| | | | |
|---|---|---|---|
| 4,049,680 A | 9/1977 | Blachford | |
| 4,217,183 A | 8/1980 | Melcher et al. | |
| 4,251,327 A * | 2/1981 | Grenon | 205/86 |
| 4,349,583 A | 9/1982 | Kulynych et al. | |
| 4,420,365 A | 12/1983 | Lehrer | |
| 4,767,489 A | 8/1988 | Lindner | |
| 4,816,549 A | 3/1989 | Rumack | |
| 5,059,449 A | 10/1991 | van der Putten et al. | |
| 5,074,918 A | 12/1991 | Bäbler | |
| 5,645,632 A | 7/1997 | Pavlin | |
| 5,783,657 A | 7/1998 | Pavlin et al. | |
| 5,981,680 A | 11/1999 | Petroff et al. | |

(Continued)

FOREIGN PATENT DOCUMENTS

| | | |
|---|---|---|
| WO | WO 03/029377 | 4/2003 |
| WO | WO 2006/105306 | 10/2006 |

OTHER PUBLICATIONS

Definition of Ipse dixit from Wikipedia, the free encyclopedia; downloaded from http://en.wikioedia.org/wiki/Ipse-dixit; Aug. 19, 2011.

(Continued)

*Primary Examiner* — Daniel Whalen
(74) *Attorney, Agent, or Firm* — John J. Piskorski (57) ABSTRACT

Methods include selectively depositing a phase change resist having high light transmittance onto a dielectric to form a pattern, etching away portions of the dielectric not covered by the resist and depositing a metal seed layer on the etched portions of the dielectric. A metal layer is then deposited on the metal seed layer by light induced plating.

10 Claims, 2 Drawing Sheets

(56) References Cited

U.S. PATENT DOCUMENTS

| | | | |
|---|---|---|---|
| 5,998,570 A * | 12/1999 | Pavlin et al. | 528/310 |
| 6,268,466 B1 | 7/2001 | MacQueen et al. | |
| 6,399,713 B1 | 6/2002 | MacQueen et al. | |
| 6,492,458 B1 | 12/2002 | Pavlin | |
| 6,552,160 B2 | 4/2003 | Pavlin | |
| 6,835,768 B2 | 12/2004 | Agur et al. | |
| 6,864,349 B2 | 3/2005 | Pavlin et al. | |
| 6,870,011 B2 | 3/2005 | MacQueen et al. | |
| 6,956,099 B2 | 10/2005 | Pavlin | |
| 7,088,572 B2 | 8/2006 | Yoshida et al. | |
| 7,208,253 B2 | 4/2007 | Mayer et al. | |
| 7,229,745 B2 | 6/2007 | Lamarre | |
| 7,288,469 B2 | 10/2007 | Sharma et al. | |
| 7,341,941 B2 | 3/2008 | Tsui et al. | |
| 2007/0085112 A1* | 4/2007 | Yamazaki et al. | 257/288 |
| 2009/0139868 A1* | 6/2009 | Shrader et al. | 205/118 |

OTHER PUBLICATIONS

Definition of Opacity (optics) from Wikipedia, the free encyclopedia; download from http://en.wikipedia.org/wiki/Opacity_(optics); Jul. 15, 2011.

"Making Cosmetics" under "Erucamide", "Stearamide" and "Stearyl Erucamide"; INCI Opacifiers; downloaded from http://www.makingcosmetics.com/inci-list/inci-opacifiers.htm; Jul. 15, 2011.

Kemamides; Material Safety Data Sheet; Chemtura; Jan. 8, 2006; pp. 1-7.

* cited by examiner

INHIBITING BACKGROUND PLATING

The present invention is directed to a method of inhibiting background plating. More specifically, the present invention is directed to a method of inhibiting background plating with a phase change resist which has a high light transmittance.

Plating on regions of a workpiece where plating is not desired is sometimes referred to as background plating. This background plating is often detrimental to the function or aesthetics of a workpiece where selective plating is desired such as, for example, in the fabrication of plated high precision electrical components. Such background plating may lead to electrical shorts in the workpiece and disfunctioning of an electrical apparatus in which the workpiece is used. Further, background plating also results in wastage of the plating material. Such wastage increases the cost of the process and ultimate product. The increased cost may be quite substantial if the particular metal being plated happens to be a precious metal such as gold, silver, platinum or palladium. Even in those situations where metal recovery from regions of background plating is desirable and practical, nevertheless metal recovery adds to the complexity and cost of the overall process for fabricating the final product.

Many conventional methods of selective plating require multiple steps. When a solid mask is used, for example, to cover regions of a workpiece where plating is not desired, the mask is applied to the workpiece, the workpiece is then selectively plated and the mask is stripped. However, there are costs and complexity associated with making, applying and stripping of the mask from the workpiece. Further, the solid mask is not always easily or able to be applied and removed from the workpiece. This is true where there are hard to reach or inaccessible regions of the workpiece that are desired to be masked. An example of such a workpiece is a photovoltaic device where flaws, cracks or pin-holes in dielectric layers coating conductive or semi-conductive materials are sites of background plating. Such defects are small and mask application to the sites is impractical. Further, the defects are often not visible to the naked eye because of their microscopic size, and workers usually do not become aware of the defects until after the metal is plated. The resulting article is then unsuitable for commercial use.

Photovoltaic devices, such as solar cells, often include a semiconductor wafer which forms a single large PN junction. Electromagnetic radiation such as sunlight incident upon that junction produces electrical carriers in the device and generates an electrical current, which is collected and conveyed to an external circuit. The generated current is roughly proportional to the incident radiation. Metallic patterns which are in ohmic contact with the two sides of the PN junction collect the current. Such metallic patterns need to provide a low resistance path to minimize resistive losses of the generated current. The metallic pattern must be limited in its physical extent, especially on the front surface of the device, so as to minimize surface area that blocks incident radiant energy, i.e. energy lost for current generation purposes. Typically, the front metallic pattern includes narrow strips of very highly conductive material. Between the narrow strips of the conductive material is a thin dielectric material coating doped semiconductor material, such as doped silicon. The dielectric layer may have a thickness of 200 nm to 500 nm. This dielectric layer may function as an antireflective layer in solar cells. Examples of such dielectric materials are silicon dioxide and silicon nitride.

During manufacture of photovoltaic devices the dielectric layer is formed on the doped semiconductor material prior to forming the metallic patterns for the device. Formation of the dielectric layer may be done by chemical vapor deposition or physical vapor deposition. Once the dielectric layer is deposited a pattern is formed by conventional imaging methods and metal is deposited in the pattern using conventional methods to make it conductive. During metallization of the pattern undesired background plating may occur due to defects in the dielectric layer resulting in an article unsuitable for commercial use. As mentioned above such defects are typically not noticeable until after metallization.

Defects, such as cracks, flaws or pin-holes, expose the doped emitter layer of the semiconductor and act as sites for background plating, thus compromising desired selective plating. Such defects are believed to be caused during one or more steps of the manufacturing process and handling of the semiconductor due to the fragility and thinness of the dielectric layer. Since the defects are small, many of which are microscopic in size, applying conventional solid masks to address the background plating problem is impractical. Many of such solid masks fail to interface with the dielectric such that background plating may take place at spaces formed between the mask and the dielectric. Additionally, such masks do not permit sufficient light to pass through to reach the doped semiconductor and provide sufficient current for metal plating in light induced and light assisted processes. Solid masks are generally made of materials which are opaque to the passage of light.

U.S. Pat. No. 4,217,183 discloses a maskless method of minimizing the background plating on an electrically conductive surface, such as a cathode, in the metallization of wafer chips used in integrated circuits and circuit boards. The cathode may be a metal, photoconductor or composite structure of an insulator and a conductor. This patent discloses placing a cathode and anode in a nickel or copper electrolyte, focusing a beam of energy, such as with an argon laser, through the electrolyte to selective regions of the cathode where plating is desired and establishing an electrical potential between the cathode and anode. Although the patent discloses a maskless method for minimizing background plating, such a method still may not be suitable for addressing the background plating caused by the defects in dielectric layers of semiconductors. Generally, the defects are not observable to the naked eye. Accordingly, selective application of the beam of energy while trying to avoid the defects would be impractical. Further, even if a pattern for directing the beam of energy was formed on the workpiece which excluded the dielectric material, sufficient energy from the beam may overlap with microscopic defects in the dielectric layer on the periphery with the pattern resulting in detrimental background plating. Accordingly, there remains a need in the industry for methods of inhibiting background plating on semiconductors.

A method includes: a) providing a doped semiconductor including an n doped front side and a p doped back side, and a dielectric layer covering the n doped front side of the doped semiconductor; b) selectively depositing a phase change resist having a light transmittance of 30% and greater onto the dielectric layer to form a pattern on the dielectric layer; c) etching away sections of the dielectric layer not covered with the phase change resist to expose sections of the n doped front side of the doped semiconductor; d) depositing a metal seed layer on the exposed sections of the n doped front side of the doped semiconductor; and e) depositing a metal layer on the metal seed layer by light induced plating.

Background plating on dielectric layers results in commercially unacceptable products. Unfortunately, defects on the dielectric layer which lead to background plating typically are not observable to the naked eye because of their microscopic size. Accordingly, workers typically do not become aware of the defects until after metallization where background plating on the dielectric layer is readily observable. Many conventional masking methods are not suitable, especially for light induced plating, since the masks are not transparent enough to allow sufficient amount of light to pass through and contact the doped semiconductor to induce a current. Additionally, many conventional non-masking methods may not be suitable as well. Unfortunately, there is no commercially practical method of removing the undesired plating from the dielectric layer and the resulting product is unsuitable for commercial use.

The method of depositing a phase change resist having a light transmittance of 30% and greater on a dielectric of a doped semiconductor addresses the problems encountered with background plating by allowing sufficient amount of light to pass through the phase change resist to reach the doped semiconductor. The light induces a current in the doped semiconductor such that metal plating on the doped semiconductor is enabled in sections not covered by the phase change resist. The phase change resist on the dielectric acts as plating resist to inhibit any background plating on the dielectric, thus metal plating is restricted to the selective sections of the doped semiconductor. The phase change resist may be deposited onto the dielectric as a liquid, semi-solid or gel using conventional apparatus. The phase change resist can fill flaws, cracks and pinholes, thus preventing undesired background plating in such areas of the dielectric. In addition the phase change resist functions as an etch resist and is compatible with many conventional acid and buffered oxide etches used in lithographic processes. Further, since the metal plating process is isotropic, and the thickness of metal plated is typically greater than the thickness of the dielectric layer, the phase change resist acts to constrain the lateral growth of the metal, reducing any unwanted shadowing of light by the plated metal. This prevents loss of incident light on the doped semiconductor layer due to metal growth.

As used throughout this specification, the terms "depositing" and "plating" are used interchangeably. The terms "current tracks" and "current lines" are used interchangeably. The indefinite articles "a" and "an" are intended to include both the singular and the plural. The term "light induced plating" is also known as "light assisted plating". The term "selectively depositing" means that deposition occurs in specific desired areas on a substrate. The term "semi-solid" means any substance having the attributes of both a solid and a liquid. The term "gel" means a colloidal suspension of a solid dispersed in a liquid. The term "transmittance" means the fraction of radiant energy, such as infrared light, visible light, ultraviolet light, X-rays and gamma rays that passes through a substance. The term "isotropic" means identical in all directions; invariant with respect to direction. The term "lux=lx" is a unit of illumination equal to one lumen/m$^2$; and one lux=1.46 milliwatt of radiant electromagnetic (EM) power at a frequency of 540 tetrahertz. The following abbreviations have the following meanings unless the context clearly indicates otherwise: ° C.=degrees Celsius; g=grams; mL=milliliter; L=liter; A=amperes; m=meter; mm=millimeter; dm=decimeter; cm=centimeter; µm=micrometers; nm=nanometers; min.=minute; sec.=second; UV=ultra violet; mJ=milli-Joule=¹⁄₁₀₀₀ of a Joule; 1 erg=1 dyne cm=10$^{-7}$ Joules. All percentages and ratios are by weight unless otherwise indicated. All ranges are inclusive and combinable in any order except where it is clear that such numerical ranges are constrained to add up to 100%.

Semiconductors of photovoltaics and solar cells may be composed of monocrystalline or polycrystalline or amorphous silicon wafers. While the description below is with regard to silicon wafers, other suitable semiconductor wafers, such as gallium-arsenide, silicon-germanium, and germanium, may also be used. When silicon wafers are used, they typically have a p-type base doping, but may have an n-type base doping.

The semiconductor wafers may be circular, square or rectangular 10 in shape or may be any other suitable shape. Such wafers may have a wide variety of dimensions. For example, circular wafers may have a diameter of 150 nm, 200 nm, 300 nm, 400 nm, or greater.

The entire back side may be metal coated 18 or a portion of the back side may be metal coated, such as to form a grid. Such back side metallization may be provided by a variety of techniques, and may be done prior to the metallization of the front side of the wafer or may be done simultaneously with the metallization of the front side of the wafer. Typically, the back side of the wafer is metallized before the front side. In one embodiment, a metal coating is applied to the back side in the form of an electrically conductive paste, such as a silver-containing paste, an aluminum-containing paste or a silver and aluminum-containing paste; however, other pastes which include metals such as nickel, palladium, copper, zinc or tin also may be used. Such conductive pastes typically include conductive particles embedded in a glass matrix and an organic binder. Conductive pastes may be applied to the wafer by a variety of techniques, such as screen printing. After the paste is applied, it is fired to remove the organic binder. Firing is typically done at temperatures of 600° C. to 800° C. When a conductive paste containing aluminum is used, the aluminum partially diffuses into the back side of the wafer, or if used in a paste also containing silver, may alloy with the silver. Use of such aluminum-containing paste may improve the resistive contact and provide a "p+"-doped region. Heavily doped "p+"-type regions ("p++"-type regions) 14 by previous application of aluminum or boron with subsequent interdiffusion may also be produced. Typically, heavily doped "p+"-type regions are made. In one embodiment, an aluminum-containing paste may be applied to the back side and fired before the application of the back side metal coating. The residue from the fired aluminum-containing paste may optionally be removed prior to the application of the back side metal coating. In an alternate embodiment, a seed layer may be deposited on the back side of the wafer and a metal coating may be deposited on the seed layer by electroless or electrolytic plating. Such metal deposition on the seed layer on the back side of the wafer may be performed simultaneously with the metal deposition on the front side of the wafer using a light induced or light assisted plating method.

The front side of the wafer may optionally be subjected to crystal-oriented texture etching in order to impart to the surface an improved light incidence geometry which reduces reflections. To produce the semiconductor junction, phosphorus diffusion or ion implantation takes place on the front side of the wafer to produce an n-doped region and provides the wafer with a PN junction. The n-doped region 12 may be referred to as the emitter layer. The n-doped region may be "n+" doped or heavily "n+" doped ("n++" doped). Typically, the emitter layer is heavily "n+" doped.

A dielectric layer is added to the front side or emitter layer of the wafer. Such dielectric layer may serve as both a passivation layer and an antireflection layer. Suitable dielectric layers include, without limitation, silicon oxide layers such as $SiO_x$, silicon nitride layers such as $Si_3N_4$, a combination of silicon oxide and silicon nitride layers, and combinations of a silicon oxide layer, a silicon nitride layer with a titanium oxide layer such as $TiO_x$. Optionally, $SiO_x$ may be used as a capping layer on $Si_3N_4$. In the foregoing formulae, x is an integer representing the number of oxygen atoms. Typically x is 2. Such dielectric layer may be deposited by a number of techniques, such as by various vapor deposition methods, for example, chemical vapor deposition and physical vapor deposition.

Figure 1:
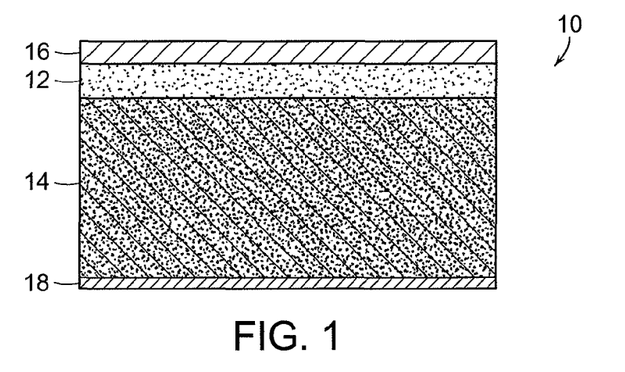
FIG. 1 illustrates a solar cell having n and p doped regions a bottom electrode and a dielectric layer on top of the n doped region.
Figure 2:
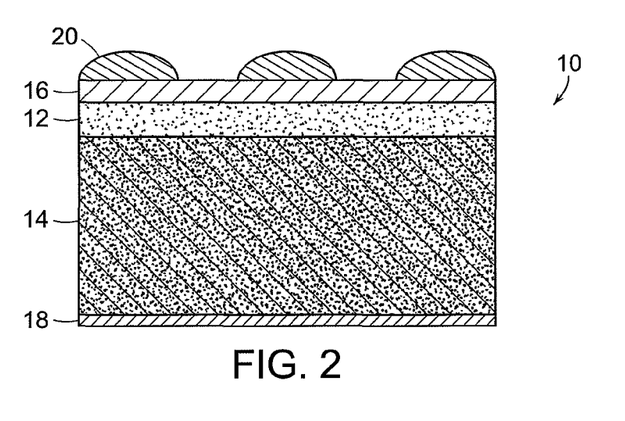
FIG. 2 illustrates the solar cell with selectively deposited phase change resist.

A phase change resist having a light transmittance of 30% and greater 20 is selectively deposited on the dielectric layer to form a pattern to outline where the current tracks and bus bars are to be formed on the front side of the wafer as shown in FIG. 2. Typically, the light transmittance is from 35% to 100%, or such as from 40% to 95%, or such as from 50% to 80%. The phase change resist may be selectively applied to the dielectric by ink jetting, aerosol spray, screen printing or lithography. Conventional ink jetting, aerosol, screen printing, and lithographic methods may be used. Also, stamping or soft lithography may be used.

Wavelengths of light transmitted through the phase change resist range from at least 300 nm and greater. Typically, the wavelength range is from 350 nm to 1500 nm, more typically from 400 nm to 1200 nm.

If the phase change resist is curable, the resist is cured prior to etching away sections of the dielectric layer for the current tracks and bus bars. Curing may be done by actinic radiation, such as light or heat using conventional curing apparatus. Typically, curing is done using UV light.

Figure 3:
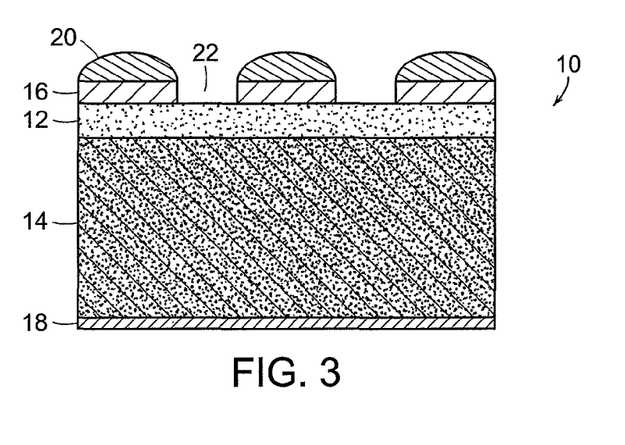
FIG. 3 illustrates the solar cell with portions of the dielectric layer etched away forming trenches.

The sections of the dielectric which are not coated with the phase change resist are then etched away to expose the n doped emitter layer 12 of the wafer as shown in FIG.3. The n doping may be n+ or n++. Typically, the emitter layer is n++ doped. Mineral acids such as hydrofluoric acid, phosphoric acid and mixtures thereof may be used to etch away the dielectric layer. Such acids are used to remove the dielectric coating. A wide range of concentrations may be used. Buffered oxide etches also may be used to etch away the dielectric layer. The phase change resist functions as an acid etch or buffered oxide etch resist and can withstand contact with the acid or buffered oxide etchants.

A trench pattern is then defined on the front side. The trench pattern reaches through the antireflective (or dielectric) layer and into the semiconductor body of the wafer. The trenches may reach a depth of 0.2 μm to 20 μm into the semiconductor body of the wafer. Deeper or shallower trench depths may be employed. The width of such trenches may be from 20 μm to 150 μm. Typically, the distance between each trench is 1 mm to 10 mm.

The front side of a wafer contains a metallized pattern. For example, the front side of a wafer may be composed of current collecting lines and current busbars. Current collecting lines are typically transverse to the busbars and typically have a relatively fine-structure (i.e. dimensions) relative to current busbars.

The phase change resist includes components which provide light transmittance of 30% and greater and provide a resist which is resistant to mineral acid etches as well as buffered oxide etches. Such materials include, but are not limited to, waxes, such as, natural waxes, chemically modified waxes, and synthetic waxes, and polyamide resins. Natural waxes include, but are not limited to, camauba wax, montan wax, vegetable waxes, fatty acid waxes. Synthetic waxes include, but are not limited to, paraffin waxes, microcrystalline polyethylene waxes, polypropylene waxes, polybutylene waxes, polyethylene acrylic waxes, polyester waxes, and Fischer-Tropsch wax. Chemically modified waxes include derivatives of waxes. Typically the waxes used are fatty acid waxes and paraffin waxes and derivatives thereof. More typically paraffin waxes are used. Examples of polyamide resins which may be used in the phase change resist are disclosed in U.S. Pat. Nos. 5,645,632; 5,783,657; 5,998,570; 6,268,466; 6,399,713; 6,492,458; 6,552,160; 5,981,680; 4,816,549; 6,870,011; 6,864,349; and 6,956,099; as well as U.S. Published Patent Application 20040186263, which are hereby incorporated, in their entirety, herein by reference. Examples of commercially available polyamide resins are Sylvaclear® 2612, Sylvagel® 5600, Sylvagel® 6100, Sylvaclear® 100, Sylvaclear® 100LM, Sylvaclear® C75v, Uniclear® 100 and Uniclear® 100v. All are obtainable from Arizona Chemical Company, Jacksonville, Fla., U.S.A.

One class of polyamide resin is an ester-terminated polyamide (ETPA). The ETPAs include at least one compound of formula (1):

wherein n designates a number of repeating units such that ester groups constitute from 10% to 50% of the total of the ester and amide groups; $R^1$ at each occurrence is independently selected from an alkyl or alkenyl containing at least 4 carbon atoms; $R^2$ at each occurrence is independently selected from a $C_{4-42}$ hydrocarbon group with the proviso that at least 50% of the $R^2$ groups have 30-42 carbon atoms; $R^3$ at each occurrence is independently selected from an organic group containing at least two carbon atoms in addition to hydrogen atoms, and optionally containing one or more oxygen and nitrogen atoms; and $R^{3a}$ at each occurrence is independently selected from hydrogen, $C_{1-10}$ alkyl and a direct bond to $R^3$ or another $R^{3a}$ such that the N atom to which $R^3$ and $R^{3a}$ are both bonded is part of a heterocyclic structure defined in part by $R^{3a}$—N—$R^3$, such that at least 50% of the $R^{3a}$ groups are hydrogen. Methods of making the ETPA polyamides are disclosed in U.S. Pat. No. 5,783,657, which is hereby incorporated, in its entirety, herein by reference.

Another class of polyamide resin is the tertiary amide terminated polyamide (ATPA). The ATPAs include at least one compound of formula (2):

where m designates a number of repeating units such that terminal amide groups (i.e., the amide groups to which $R^4$ is directly bonded) constitute from 10% to 50% of the total amide groups of the ATPA; $R^4$ at each occurrence is independently selected from $C_{1-22}$ hydrocarbon group; $R^5$ at each occurrence is independently selected from $C_{2-24}$ hydrocarbon group; $R^6$ at each occurrence is independently selected from an organic group containing at least two carbon atoms in addition to hydrogen atoms, and optionally containing one or more oxygen and nitrogen atoms; and $R^{6a}$ at each occurrence is independently selected from hydrogen, $C_{1-10}$ alkyl and a direct bond to $R^6$ or another $R^{6a}$ such that the N atom to which $R^6$ and $R^{6a}$ are both bonded is part of a heterocyclic structure defined in part by $R^{6a}$—N—$R^6$. Methods of making the ATPA polyamide are disclosed in U.S. Pat. No. 6,268,466, which is hereby incorporated, in its entirety, herein by reference.

In a further class of polyamide resin is polyalkylene oxy-terminated polyamide (PAOPA). PAOPAs contain at least one block copolymer of the formula: hydrocarbon-polyether-polyamide-polyether-hydrocarbon. The polyamide block includes blocks of formula (3):

where $R^7$ is a hydrocarbon diradical, such as dimer acid-derived, e.g. where $R^7$ group includes a diradical that results when two carboxylic acid groups are removed from dimer acid; $R^8$ is selected from a hydrocarbon and a polyether diradical; the polyether block includes blocks of formula (4): —($R^9$—O)—, where $R^9$ is a hydrocarbon; $C_{1-22}$ hydrocarbon radicals are located at either end of the copolymer, where the hydrocarbon radical may optionally be selected from alkyl, aralkyl, aryl and alkaryl radicals. Methods of making the PAOPA are disclosed in U.S. Pat. No. 6,399,713, which is hereby incorporated, in its entirety, herein by reference.

Waxes and polyamide resins are included in the phase change resist in amounts such that the phase change resist is sufficiently transparent enough to allow enough light to pass through it to reach the doped semiconductor wafer for an adequate current to be generated for metal deposition. Waxes and polyamide resins may be in amounts of 10% by weight to 100% by weight, or such as from 20% by weight to 80% by weight, or such as from 30% by weight to 70% by weight, or such as from 40% by weight to 60% by weight.

Optionally, one or more additives may be included in the resist composition. Such additives include, but are not limited to, crosslinking agents, antioxidants, wetting agents, plasticizers, inorganic fillers, dyes, pigments, optical brighteners, thickeners and photoinitiators. Conventional crosslinking agents, photoinitiators and other additives may be used. Additives are included in amounts such that they do not compromise the light transmittance of the phase change resist and current generation in the doped semiconductor wafer.

If the phase change resist is curable, one or more crosslinking agents are included. The crosslinking agents include mono-functional monomers and oligomers, difunctional monomers and oligomers and trifunctional monomers and oligomers. Such crosslinking agents are included in the phase change resist in amounts of 20% by weight to 80% by weight, or such as from 30% by weight to 70% by weight.

Illustrative examples of crosslinking agents include allyl methacrylate, ethylene glycol dimethacrylate, diethylene glycol dimethacrylate, diethylene glycol dimethacrylate, triethylene glycol dimethacrylate, polyethytlene glycol dimethacrylate, 1,3-butylene glycol dimethacrylate, 1,6-hexanediol dimethacrylate, neopentyl glycol dimethacrylate, polypropylene glycol dimethacrylate, 2-hydroxy1,3-dimethacryloxypropane, ethylene glycol diacrylate, diethyl-ene glycol diacrylate, triethylene glycol diacrylate, polyethylene glycol diacrylate, 1,3-butylene glycol diacrylate, 1,6-hexanediol diacrylate, neopentyl glycol diacrylate, polypropylene glycol diacrylate, isodecyl acrylate, isodecyl diacrylate, stearyl acrylate, stearyl methacrylate, tripropylene glycol diacrylate, propoxylated neopentyl glycol diacrylate, trimethylolpropane triacrylate, trimethylolpropane trimethacrylate, tetramethylolmethane triacrylate, tetramethylmethane tetracrylate, polyester diacrylate and polyester dimethacrylate.

Photoinitiators which may be included in the phase change resist include, but are not limited to benzoin ethers, benzophenones, thioxanthones, ketals and acetophenones. Photoinitiators are included in amounts of 1% by weight to 15% by weight, or such as from 5% by weight to 10% by weight.

Illustrative examples of photoinitiators include isopropyl benzoin ether, isobutyl benzoin ether, benzophenone, Michler's ketone, chlorothioxanthone, 2-isopropylthioxan-thone, dodecylthioxanthone, benzyl dimethyl ketal, acetaphenone diethyl ketal, 1-hydroxy-cyclohexyl-phenyl-ketone and 2-hydroxyl-2-methylphenyl propanone.

In addition to functioning as an etch resist, the phase change resist functions as a plating resist to prevent background plating. The phase change resist is deposited onto the dielectric layer as a liquid or semi-solid, such as a gel. Typically, the phase change resist is deposited at temperatures of 70° C. to 120° C. If the phase change resist is deposited as a liquid, it cools sufficiently on the dielectric to form a semi-solid, gel or solid etch and plating resist. The phase change resist seals pin-holes, cracks and flaws in the dielectric layer, thus inhibiting any undesired background plating on the dielectric. Further, metal does not deposit on the resist, thus it acts as a barrier. In addition, since the metal plating is isotropic and the thickness of the metal plated is typically greater than the thickness of the dielectric layer, the phase change resist acts to constrain the lateral growth of metal, reducing any unwanted shadowing of light by the plated metal. This prevents loss of incident light on the doped semiconductor layer due to metal growth. The phase change resist is deposited onto the dielectric to a thickness of at least 10 µm, or such as from 10 µm to 50 µm, or such as from 15 µm to 30 µm.

Figure 4:
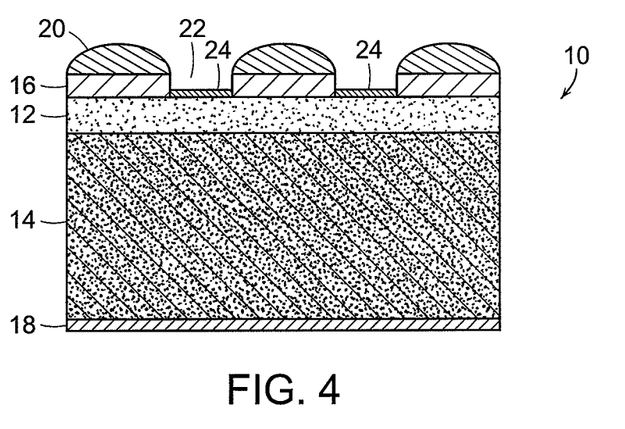
FIG. 4 illustrates the solar cell with a metal seed layer deposited on the exposed n doped region of the trenches.
Figure 5:
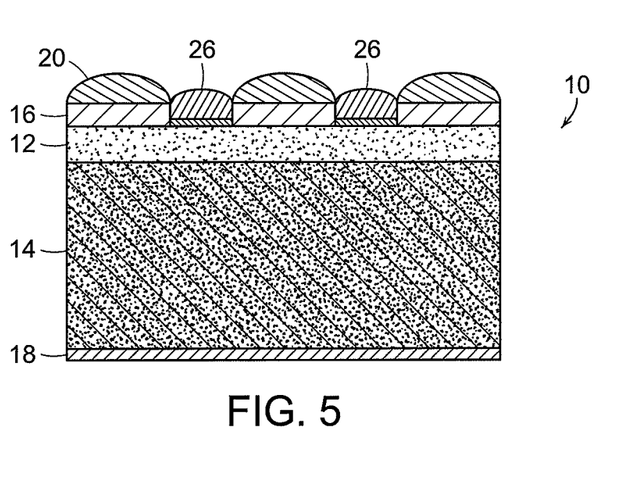
FIG. 5 illustrates the solar cell with a metal layer deposited on the metal seed layer.

After the phase change resist 20 is selectively applied to the dielectric 16 to form a pattern on the dielectric, the sections of the dielectric which are not covered by the phase change resist are etched away to form trenches 22 to expose the n doped emitter layer 12 of the doped semiconductor wafer 10. The trenches of the dielectric layer correspond to the sites of the current tracks and bus bars. A first metal layer or metal seed layer 24 is then deposited on the exposed n doped emitter layer of the doped semiconductor as shown in FIG. 4. Such metal seed layers provide an anchoring point for a second metal layer 26, a barrier against silver or copper migration, and a conductive layer for initiating plating uniformity of the second metal layer as shown in FIG. 5. The metal seed layer may be nickel, palladium or silver. Nickel and palladium may be deposited in the trenches by using conventional electroless processes as well as conventional physical vapor deposition processes. Silver may be deposited by conventional physical vapor deposition or as a conductive paste. Conventional electroless compositions may be used as well as conventional silver conductive pastes may be used. Such metal seed layers may be deposited to thicknesses of 0.01 µm to 10 µm, or such as from 0.5 µm to 5 µm.

Optionally, the metal seed layer can be sintered to form a metal silicide, such as a nickel, palladium or silver silicide. Sintering may be done at temperatures of 300° C. to 800° C. Prior to sintering the phase change resist may be stripped from the doped semiconductor wafer. Alternatively, the wafer with the resist may be placed in the sintering oven where the resist is burned from the wafer during the sintering process. After sintering, the wafer is cooled to room temperature and the phase change resist is selectively reapplied to the wafer.

A second metal layer is deposited on the metal seed layer by light induced plating where both light and external current are used. The light may be continuous or pulsed. The doped semiconductor with the phase change resist is immersed in a metal plating composition and light is applied to the doped semiconductor. An applied potential may have a range of current density. Typical current densities are from 0.1 A/dm$^2$ to 10 A/dm$^2$, and more typically from 0.1 A/dm$^2$ to 5 A/dm$^2$. The particular current requirement is dependent upon the particular size of the doped semiconductor wafer. If the front of the wafer is illuminated and the external potential is reduced to 50 milliamperes or less, the plating continues normally on the front surface but no plating occurs on the rear of the wafer. Front illumination improves the uniformity of the rear plating and overcomes all of the difficulties associated with ohmic drops through the seed layer to points distant from the electrical contact. The plating process may optionally include one or more reverse plating steps, such as a pulse periodic reverse plating process. The thickness of the second metal layer ranges from 5 μm to 50 μm, or such as from 10 μm to 30 μm, or such as from 15 μm to 25 μm.

Light which may be used in the metal plating process of the second metal includes, but is not limited to, visible light, infrared, UV light and X-rays. Light sources include, but are not limited to, incandescent lamps, infrared lamps, fluorescent lamps, halogen lamps and lasers. The amount of light applied to the semiconductor is from 500 lx to 20,000 lx, or such as 1000 lx to 15,000 lx or such as from 5000 lx to 10,000 lx.

Metal layers may be any suitably conductive metal. Typically, the metal is silver or copper. Metal compositions which may be used include electroless, immersion or electrolytic compositions. The electroless metal plating composition may or may not include a reducing agent. Examples of commercially available electroless silver compositions include Silveron™ Ag100 and Silver Glo™3k. Examples of commercially available electroless copper compositions include Cuposit™ 328L, Circuposit™ 880, 3361-1, 253, 3350, 4500, 3350-1 and 4750. An example of a commercially useful silver electroplating bath is available as ENLIGHT™ 600 silver plate. All are available from Rohm and Haas Electronic Materials, LLC, Marlborough, Mass., U.S.A.

The patterned doped semiconductor wafer with the phase change resist is submerged in a plating composition contained in a plating cell. A light source is positioned to illuminate the semiconductor wafer with light energy. Because the phase change resist has a light transmittance of 30% and greater, sufficient light passes through the phase change resist such that metal plating occurs. If the patterned doped semiconductor wafer is a silicon solar cell, the light source can be, for example, a quartz-halogen lamp which provides energy similar to that of the solar spectrum to which the silicon solar cell is photovoltaically sensitive. A variety of other light sources may be used, such as, but not limited to, incandescent lamps such as a 250 Watt lamp, mercury lamps, fluorescent tube lamps and light emitting diodes (LEDs). The light energy can be either continuous or pulsed. Pulsed illumination can be achieved, for example, by interrupting the light with a mechanical chopper.

The plating cell is of such a material as to be chemically inert with respect to the plating composition and is transparent to light energy. Alternatively, the doped semiconductor wafer can be positioned horizontally in the plating cell and illuminated from above or below the plating composition, in which case the plating cell need not be transparent.

By illuminating the front of the doped semiconductor wafer with light energy plating occurs on the front except on the sections coated with the phase change resist composition. The impinging light energy generates a current in the solar cell. The rate of plating on the front side of the doped semiconductor wafer is a function of the intensity of the radiation incident on the wafer since the generated current is proportional to the incident intensity. The rate of plating on the front is controllable by adjusting the light intensity or by applying a back side potential to the metallized back side.

Optionally, a strike layer of silver or tin may be deposited on the second metal layer when it is off copper. Conventional methods and plating baths may be used to deposit the strike layer. The strike layer protects the copper from oxidation. The thickness of the strike layer is conventional. It may range from 0.01 μm to 0.5 μm.

The metal ions in the plating baths may be provided by using any suitable solution-soluble metal compound, typically a metal salt. Such metal compounds may include, without limitation: metal halides; metal nitrate; metal carboxylates such as acetate, metal formate and metal gluconate; metal-amino acid complexes such as metal-cysteine complexes; metal alkyl sulfonates such as metal methane sulfonate and metal ethane sulfonate; metal alkylol sulfonates, metal tolyl sulfonates, and metal phenol sulfonates; and metal cyanides. Exemplary metal compounds include, but are not limited to silver, copper and tin compounds. Silver compounds include, but are not limited to, silver nitrate, silver-cysteine complex, silver methane sulfonate, silver ethane sulfonate, silver propane sulfonate, silver phenol sulfonate, and silver acetate. When the metal is silver, the metal salt is typically not a silver halide due to the limited solubility of such salts. Copper compounds include, but are not limited to, copper pyrophosphate, copper gluconate, copper sulfate and copper chloride. Tin compounds include, but are not limited to, tin halides and tin alkysulfonates. Mixtures of metal compounds may be used in the present plating baths. Such mixtures may be metal compounds having the same metal but being different compounds, such as a mixture of copper sulfate and copper chloride, or silver nitrate and silver-cysteine complex or metal compounds having different metals such as a mixture of silver-cysteine complex and copper gluconate. When different metal compounds having different metals are used in admixture, the present metal plating baths deposit an alloy of the different metals.

The metal compounds are included in an amount sufficient to provide a metal ion concentration in the plating composition of 0.1 to 150 g/L, more typically from 0.5 to 100 g/L, and still more typically from 1 to 70 g/L. When the metal ions are silver ions, the concentration of silver ions in the bath is typically in an amount of 2 to 40 g/L. Such metal compounds are generally commercially available from a variety of sources, such as Aldrich chemical company, Milwaukee, Wis.

When the metal plating compositions are electroplating compositions an electrolyte is included. Any of a wide variety of electrolytes may be used in the metal plating compositions, including acids and bases. Exemplary electrolytes include, without limitation, alkane sulfonic acids such as methane sulfonic acid, ethane sulfonic acid and propane sulfonic acid; alkylol sulfonic acids; aryl sulfonic acids such as toluene sulfonic acid, phenyl sulfonic acid and phenol sulfonic acid; amino-containing sulfonic acids such as amido sulfonic acid; sulfamic acid; mineral acids; carboxylic acids such as formic acid and haloacetic acids; hydrogen halide acids; and pyrophosphate. Salts of acids and bases also may be used as the electrolyte. Further, the electrolyte may contain a mixture of acids, a mixture of bases or a mixture of one or more acids with one or more bases. Such electrolytes are generally commercially available from a variety of sources, such as Aldrich chemical company.

While not intending to be bound by theory, when the metal composition includes silver it is believed that the nitro-containing compounds in the plating composition function to stabilize and complex the bath. Any of a wide variety of water-soluble nitro-containing compounds may be used. Such nitro-containing compounds include, without limitation, nitro-containing carboxylic acids and their salts and nitro-containing sulfonic acids and their salts. Such nitro-containing compounds may contain one or more nitro-groups. The water-soluble nitro-containing compound typically has at least one heterocyclic group. In a further embodiment, the nitro-containing compound is an aromatic heterocyclic compound. Exemplary nitro-containing compounds include, without limitation, 2-nitrophthalic acid, 3-nitrophthalic acid, 4-nitrophthalic acid and/or m-nitrobenzene sulfonic acids. Typically, the nitro-containing compound is used in an amount of 0.1 to 200 g/L of the bath, and more typically 0.5 to 175 g/L and still more typically 1 to 150 g/L. Such nitro-containing compounds are generally commercially available form a variety of sources, such as Aldrich chemical company.

A wide variety of surfactants may be used in the plating compositions. Any of anionic, cationic, amphoteric and non-ionic surfactants may be used. Exemplary nonionic surfactants include esters of succinic acid. Surfactants may be chosen from cationic and amphoteric surfactants. Exemplary cationic surfactants include, but are not limited to, 1,3-didecyl-2-methylimidazolium chloride available from Degussa under the trademark TEGOTAIN™. Surfactants may be amphoteric, such as an alkylbetaine available from Degussa under the trademark TEGOTAIN™. Mixtures of surfactants may be used. Such surfactants are typically present in the plating composition in an amount of 0.1 to 5 g/L.

Optionally, when the plating composition includes silver vitamins may be included. They may be fat-soluble or water-soluble. Typically, a water-soluble vitamin is used. Suitable fat-soluble vitamins include A, $D_1$, $D_2$, $D_3$, $K_1$, $K_2$, and E. Suitable water-soluble vitamins include C, $B_1$, $B_2$, $B_3$, $B_6$ and $B_{12}$. Exemplary vitamins include, without limitation, retinol, sterols, ergocalciferol, cholecalciferol, phytonadione, multiprenylmenaquinone, α-tocopherol, β-tocopherol, ascorbic acid, thiamin, nicotinic acid, riboflavin, pantothenic acid, biotin, pyridoxine, folic acid and cyanocobalamin. Typically, the vitamins used are ascorbic acid, thiamin, nicotinic acid, riboflavin, pantothenic acid, biotin, pyridoxine, and folic acid. As used herein, the term "vitamin" is intended to include the salts of vitamins.

In general, when vitamins are added to the compositions, vitamins are present in the plating compositions in amounts of 0.01 to 150 g/L, typically from 0.5 to 100 g/L and more typically from 1 to 100 g/L. Vitamins are generally commercially available from a variety of sources, such as Aldrich chemical company.

A wide variety of amido-compounds may be used. Suitable amido-containing compounds include, without limitation, sulfonic acid amides such as succinic acid sulfamide and carboxylic acid amides such as succinic acid amide (succinamic acid).

In general, amido-compounds, when used, are present in the plating compositions in an amount of 0.01 to 150 g/L, typically from 0.5 to 100 g/L and more typically from 1 to 100 g/L. Amido-compounds are generally commercially available from a variety of sources, such as Aldrich chemical company. Additionally amido-compounds may be generated in situ from imides, such as, for example, succinimide. While not being bound by theory, imides added to an alkaline bath at bath temperatures convert to their corresponding amido-compounds. This is believed to occur through nucleophilic attack by hydroxyl ions ($OH^-$) at a carbon-nitrogen bond (C—N) of the imide.

Amino acids also may be used in the plating compositions, including derivatives of amino acids and salts of amino acids. The amino acids may contain one or more mercapto groups in addition to one or more amino groups. Examples of suitable amino acids include, but are not limited to, glycine, alanine, cysteine, methionine and 4-amino-nicotinic acid. When an amino acid is used in the plating baths it is used in an amount of 0.1 to 150 g/L, more typically from 0.5 to 150, and more typically from 0.5 to 125 g/L. Mixtures of amino acids may be used. Such amino compounds are generally commercially available form a variety of sources, such as Aldrich chemical company. When the metal is silver, the water-soluble amino acid compound is typically present in excess of the stoichiometric amount of silver.

A wide variety of water soluble sulfonic acids may be used in the plating compositions. Exemplary sulfonic acids include any of the sulfonic acids described above for the electrolyte. When a sulfonic acid is used as the electrolyte, no additional sulfonic acid is required. Typically, the sulfonic acid is present in an amount of 0.1 to 200 g/L.

Optionally, the plating compositions may contain one or more additional components. Such additional components include, without limitation, brighteners, grain refiners, ductility enhancers, anti-tarnish agents, and anti-freeze agents. Sulfone-containing compounds may be used as brighteners. In particular, suitable sulfone-containing compounds contain one or two aromatic rings on the sulfone group. Such aromatic rings may optionally be substituted by one or more substituents chosen from nitro, amino, halo, alkyl, and metals. When present, the sulfone-containing compound is typically used in an amount of 0.001 to 5 g/L of the plating composition.

A wide variety of anti-tarnish agents may optionally be used in the plating compositions. Suitable anti-tarnish agents include, without limitation, triazoles, benzotriazoles, tetrazoles, imidazoles, benzimidazoles, and indazoles. Typically the anti-tarnish agents are ($C_1$-$C_{16}$)alkylimidazoles and arylimidazoles. Exemplary anti-tarnish agents include, but are not limited to, methylimidazole, ethylimidazole, propylimidazole, hexylimidazole, decylimidazole, undecylimidazole, 1-phenylimidazole, 4-phenylimidazole, hydroxybenzotriazole, aminobenzotriazole, 2-imidazolecarboxaldehyde, benzotriazolecarboxylic acid, 2-guanidinobenzimidazole, 2-aminoindazole, chlorobenzotriazole, hydroxyethylbenzotriazole, hydroxyethylimidazole, hydroxybenzimidazole and 1,2,4-triazole. Mixtures of anti-tarnish may be used in the plating baths. In general, when an anti-tarnish agent is used, it is present in an amount from 0.005 to 50 g/L.

When the metal plating composition is an electroless or immersion metal composition, reducing agents may be included. A wide variety of reducing agents are known in the art for such metal plating compositions. Such reducing agents include, but are not limited to sodium hypophosphite, sodium hypophosphite, potassium hypophosphite, thiourea and thiourea derivatives, hydantoin and hydantoin derivatives, hydroquinone and hydroquinone derivatives, resorcinol, and formaldehyde and formaldehyde derivatives. Such reducing agents may be used in amounts of 0.1 g/L to 40 g/L or such as from 1 g/L to 25 g/L or from 10 g/L to 20 g/L.

The metal plating composition may optionally contain a buffering agent. Exemplary buffering agents include, but are not limited to, borate buffer (such as borax), phosphate buffer, citrate buffer, carbonate buffer, and hydroxide buffer. The amount of the buffer used is that amount sufficient to maintain the pH of the plating composition at a desired level, such amount being well known to those skilled in the art.

An alloying metal may optionally be added to the plating composition. Any suitable alloying metal may be used. Such alloying metals are well known to those skilled in the art.

Metal plating compositions may have a pH in the range of 1 to 14, typically from 1 to 12, and still more typically from 1 to 10. The working temperature of the plating compositions during metal plating is from 10 to 100° C., or such as from 20 to 60° C. When the plating composition includes silver, the working temperature is typically in the range of 10 to 20° C., and more typically from 15 to 20° C. A chiller is typically used to maintain the plating composition at a temperature below room temperature.

After the second metal layer and any strike layer is deposited and prior to firing the metal, the phase change resist is stripped from the dielectric. The phase change resist may be stripped with any suitable stripping composition. Such strippers include, but are not limited to, alkaline based strippers, such as sodium hydroxide, potassium hydroxide, monoethanol amine, choline, tetra-methyl ammonium hydroxide or mixtures thereof. Additionally, the phase change resist may be removed by thermal stripping. Thermal striping may be done at temperatures of 40° C. to 50° C.

One or more additional metal layers may be deposited on the second metal layer for reinforcement. Such additional metal layers may be nickel, copper, silver or tin. Mixtures of tin and nickel can be plated from an aqueous bath comprising stannous chloride, nickel chloride, ammonium hydroxide, and ammonium fluoride. The tin nickel mixtures have found use as an environmentally inert cap over other metal layers. In addition, when the final metal layer is copper, a strike coating of silver or tin may be deposited on the copper to inhibit oxidation of the copper. Such additional metal layers may be deposited by electroless, immersion, electrolytic, light assisted or by light induced metal plating using conventional plating baths. Typically, such reinforced metal layers range from 1 µm to 10 µm. Strike coatings of silver or tin may range from 0.01 µm to 0.5 µm.

When the one or more additional metal layers are deposited by electrolytic plating, the applied potential used may have a wide range of current density. Typical current densities are from 0.1 A/dm$^2$ to 20 A/dm$^2$, and more typically from 1 A/dm$^2$ to 10 A/dm$^2$. The particular current requirement is dependent upon the particular size of the wafer used. The electroplating processes used are conventional.

The phase change resist has a transmittance of radiant energy of 30% and greater to permit metal plating on a doped semiconductor wafer. Simultaneously the phase change resist acts as a plating resist to inhibit any background plating on the dielectric, thus metal plating is restricted to the selectively desired sections of the doped semiconductor. Since the metal plating process is isotropic and the thickness of metal plated is typically greater than the thickness of the dielectric layer, the resist acts to constrain the lateral growth of metal, reducing any unwanted shadowing of light by the plated metal. This prevents loss of incident light on the doped semiconductor layer due to metal growth. In addition the phase change resist functions as an etch resist and is compatible with many conventional acid and buffered oxide etches used in lithographic processes.

The following examples are included to illustrate various aspects of the invention but are not intended to limit the scope of the invention.

EXAMPLE 1

A doped monocrystalline silicon wafer is provided having a pn-junction. The front side or emitter layer of the doped monocrystalline silcon wafer is textured and is n++ doped. The back side is p++ doped with aluminum. The region between the n++ doped emitter layer and the p++ doped back side is n+ doped. The front side of the doped monocrystalline silicon wafer is coated with a layer of $Si_3N_4$ 500 nm thick. The $Si_3N_4$ is a dielectric which functions as an antireflective layer.

A phase change resist including 20% by weight of Sylgavel® 6100 polyamide resin, 40% by weight isodecyl methacrylate, 35% by weight propoxylated neopentayl glycol dimethacrylate and 5% by weight of a photoinitiator package composed of 1-hdroxy-cyclohexyl-phenyl-ketone and 2-isopropylthioxanthone is selectively deposited by a conventional ink jet apparatus (obtainable from Schmid) at 100° C. to coat the dielectric layer to form a pattern outlining sites for conductive current tracks. The phase change resist is deposited such that the distance between each current track is 2 mm. The phase change resist coating on the dielectric layer is 10 µm. The phase change resist is then cured by fusion UV belt system from 400 to 1600 mJ/cm$^2$. The light transmittance of the resist composition is expected to be greater than 91% in a wavelength range of 300 nm and greater.

The doped semiconductor wafer is then etched with 40% hydrofluoric acid at 25° C. for 2 to 10 minutes to etch away sections of the $Si_3N_4$ dielectric not covered by the phase change resist to expose the n++ doped emitter layer. During the etching process, the aluminum back side of the wafer is protected from the acid etch by the same phase change resist as is applied to the front side. The current tracks formed in the emitter layer by the etching are 20 µm wide and 0.9 µm deep. The acid etch is not expected to etch away the phase change resist. The wafer is removed from the acid etch and rinsed with deionized water.

A nickel seed layer 0.5 µm thick is deposited in the current tracks by immersing the doped semiconductor wafer in an electroless nickel bath having the formulation in the table below.

TABLE 1

| COMPONENT | AMOUNT |
| --- | --- |
| Nickel as nickel methane sulfonate | 6 g/L |
| Sodium hypophosphite | 25 g/L |
| Malic acid | 20 g/L |
| Lactic acid | 10 g/L |
| Boric acid | 5 g/L |
| Acetic acid | 2 g/L |

The current tracks are then plated by light induced plating with a layer of silver using the aqueous electroplating composition having components disclosed in the table below.

TABLE 2

| | |
| --- | --- |
| 8 g/L silver as silver gluconate | 2 g/L m-nitrobenzene sulfonic acid |
| 10 g/L methane sulfonic acid solution (70%, neutralized with potassium hydroxide solution) | 25 g/L succinic acid amide |
| 4 g/L methionine | 1 mL/L TEGOTAIN 485 (1% aqueous solution) |

TABLE 2-continued

| 20 g/L borax | 0.1 mL/L sulfone derivative (1% aqueous solution) |
| --- | --- |
| 20 g/L succinic acid sulfamide | |

A plating cell containing the silver plating bath of Table 2 and equipped with a 250 Watt lamp and a silver anode is provided. The patterned wafer is immersed in the plating bath. A current density of 1-5 A/dm² is applied with irradiation. Plating is done until an electrodeposited layer of silver having a thickness of 10 µm is obtained over the nickel seed layer. No background plating of silver is expected on the $Si_3N_4$ layer.

The phase change resist is stripped from the $Si_3N_4$ dielectric layer with 3.5% sodium hydroxide. The wafer is then fired in a conventional oven at 600° C.

EXAMPLE 2

A doped polycrystalline silicon wafer is provided having a pn-junction. The front side or emitter layer of the doped polycrystalline silcon wafer is textured and is n++ doped. The back side is p++ doped with aluminum. The region between the n++ doped emitter layer and the p++ doped back side is n+ doped. The front side of the doped polycrystalline silicon wafer is coated with a layer of $Si_3N_4$ 500 nm thick. The $Si_3N_4$ is a dielectric which functions as an antireflective layer.

A pattern for current tracks is then formed on the dielectric layer. A phase change resist including 20% by weight of Sylvaclear® C75V polyamide wax, 40% by weight isodecyl methacrylate, 35% by weight tripropylene glycol dimethacrylate and 5% by weight of a photoinitiator package composed of 1-hdroxy-cyclohexyl-phenyl-ketone and 2-isopropylthioxanthone is selectively deposited by a conventional screen printing process and apparatus to coat sections of the dielectric layer to form a pattern for the current tracks. The phase change resist is deposited such that the distance between each current track is 5 mm. The phase change resist coating on the dielectric layer is 10 µm thick. The phase change resist is then cured by fusion UV belt system from 400 to 1600 mJ/cm². The light transmittance of the resist is expected to be greater than 91% in a wavelength range of 300 nm and greater.

The doped polycrystalline silicon wafer is then immersed in a 40% aqueous hydrofluoric acid etch at 25° C. for 2 to 10 minutes to etch away sections of the $Si_3N_4$ dielectric not covered by the phase change resist to expose the n++ doped emitter layer. The aluminum back side of the wafer is protected from the acid etch by the same phase change resist as is on the front side. The current tracks formed in the emitter layer by the etching are 20 µm wide and 0.9 µm deep. The hydrofluoric acid etch is not expected to etch away the phase change resist. The wafer is removed from the acid etch and rinsed with deionized water. A seed layer of palladium metal 0.1 µm thick is deposited in the current tracks using Palladep™ BP autocatalytic process (obtainable from Rohm and Haas Electronic Materials, LLC, Marlborough, Mass.).

The palladium seed layer of the current tracks is then plated by light induced plating with copper using Copper Gleam™ Cu-Pulse copper plating bath (obtainable from Rohm and Haas Electronic Materials, LLC). The light source is a 250 Watt lamp and the current density is 1 to 5 Amps/dm². Plating is done until an electrodeposited layer of copper having a thickness of 10 µm is obtained over the palladium seed layer. No background plating of copper is expected on the $Si_3N_4$ layer.

A strike layer of tin is deposited on the copper to protect it from oxidation. A 250 Watt lamp serves as a source of light. Tin plating is done from 1 to 5 Amps/dm². The strike layer is 0.1 µm thick.

The Phase change resist is then stripped from the $Si_3N_4$ dielectric layer with 0.5% potassium hydroxide. After the resist is stripped from the dielectric, the wafer is fired in a conventional oven at 700° C.

EXAMPLE 3

A doped monocrystalline silicon wafer is provided having a pn-junction. The front side or emitter layer of the doped monocrystalline silcon wafer is textured and is n++ doped. The back side is p++ doped with aluminum. The region between the n++ doped emitter layer and the p++ doped back side is n+ doped. The front side of the doped monocrystalline silicon wafer is coated with a layer of $Si_3N_4$ 500 nm thick. The $Si_3N_4$ is a dielectric which functions as an antireflective layer.

A pattern for current tracks is then formed on the dielectric layer. A phase change resist including 10% by weight of a polyamide resin, 10% by weight of paraffin wax, 40% by weight stearyl acrylate, 35% by weight 1,6-hexanediol diacrylate and 5% by weight of a photoinitiator package composed of 1-hdroxy-cyclohexyl-phenyl-ketone and 2-isopropylthioxanthone is selectively deposited by Optomec M³D® aerosol jet deposition system (obtainable from Optomec®) at 80° C. to coat sections of the dielectric layer to form the pattern for the current tracks. The phase change resist is deposited such that the distance between each current track is 3 mm. The phase change resist is deposited on the dielectric layer at a thickness of 10 µm. The resist is then cured by fusion UV belt system from 400 to 1600 mJ/cm². The light transmittance of the phase change resist is expected to be greater than 91% at a wavelength range of 300 nm and greater.

The $Si_3N_4$ dielectric layer not coated with the resist is then etched away to expose sections of the n++ doped emitter layer. Etching is done with a 40% hydrofluoric acid etch at 25° C. for 2 to 10 minutes to form current tracks 20 µm wide and 0.5 µm deep in the emitter layer. The acid etch is not expected to etch away the resist. The aluminum back side of the wafer is also protected from the acid etch by the same resist as is applied to the front side of the wafer. The current tracks are plated with electroless nickel to form a nickel seed layer 0.1 µm thick. The nickel is deposited using Niplate™ 600 mid-phosphorous electroless nickel bath (obtainable from Rohm and Haas Electronic Materials, LLC).

The nickel seed layer is then coated with a layer of silver 10 µm thick. Enlight™ 600 silver plating bath is used to deposit the silver by light induced plating. The pH of the plating bath is maintained in the range of 9 to 12. The temperature of the plating bath is maintained at 25 to 35° C. A plating cell containing the silver plating bath and equipped with a 250 Watt lamp and a silver anode is provided. The wafer is immersed in the plating bath. A current density of 1-5 A/dm² is applied with irradiation. Plating is continued until the desired thickness of silver is achieved. No background plating of silver is expected. on the dielectric layer.

The phase change resist is stripped from the $Si_3N_4$ dielectric by thermal stripping. Thermal stripping is done in a conventional oven at a temperature of 50° C. The metallized wafer is then fired in a conventional oven at 800° C.

What is claimed is:

1. A method comprising:
   a) providing a doped semiconductor comprising an n doped front side and a p doped back side, and a dielectric layer covering the n doped front side of the doped semiconductor;
   b) selectively depositing a phase change resist having a light transmission of 30% or greater onto the dielectric layer to form a pattern on the dielectric layer;
   c) etching away sections of the dielectric layer not covered with the phase change resist to expose sections of the n doped front side of the doped semiconductor;
   d) depositing a metal seed layer on the exposed sections of the n doped front side of the doped semiconductor; and
   e) depositing a metal layer on the metal seed layer by light induced plating.

2. The method of claim 1, wherein the phase change resist comprises one or more waxes.

3. The method of claim 1, wherein the phase change resist comprises one or more polyamide resins.

4. The method of claim 1, wherein etching is done with an acid or a buffered oxide.

5. The method of claim 1, wherein the phase change resist is selectively deposited by ink jetting, aerosol spray, screen printing or lithography.

6. The method of claim 1, wherein the metal seed layer is nickel, palladium or silver.

7. The method of claim 1, wherein the metal layer is copper or silver.

8. The method of claim 1, further comprising a step of curing the phase change resist.

9. The method of claim 1, further comprising a step of stripping the phase change resist.

10. The method of claim 1, wherein the phase change resist is deposited as a liquid, semi-solid or gel.

* * * * *